United States Patent
Kageyama

(10) Patent No.: US 11,201,262 B2
(45) Date of Patent: Dec. 14, 2021

(54) LIGHT-EMITTING ELEMENT

(71) Applicant: NICHIA CORPORATION, Anan (JP)

(72) Inventor: Hiroaki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 199 days.

(21) Appl. No.: 16/693,547

(22) Filed: Nov. 25, 2019

(65) Prior Publication Data

US 2020/0176632 A1 Jun. 4, 2020

(30) Foreign Application Priority Data

Nov. 29, 2018 (JP) ............................... JP2018-223650

(51) Int. Cl.
*H01L 33/20* (2010.01)
*H01L 33/40* (2010.01)
*H01L 33/38* (2010.01)
*H01L 33/62* (2010.01)

(52) U.S. Cl.
CPC ............ *H01L 33/20* (2013.01); *H01L 33/385* (2013.01); *H01L 33/40* (2013.01); *H01L 33/62* (2013.01)

(58) Field of Classification Search
CPC ..... H01L 33/20; H01L 33/382; H01L 33/385; H01L 33/387; H01L 33/40; H01L 33/62
See application file for complete search history.

(56) References Cited

U.S. PATENT DOCUMENTS

| | | | |
|---|---|---|---|
| 9,412,907 B1* | 8/2016 | Place | H01L 33/08 |
| 9,812,623 B2* | 11/2017 | Lee | H01L 27/156 |
| 10,566,500 B2* | 2/2020 | Pfeuffer | H01L 33/405 |
| 2011/0049555 A1* | 3/2011 | Engl | H01L 33/382 |
| | | | 257/98 |
| 2011/0260205 A1* | 10/2011 | Moosburger | H01L 33/005 |
| | | | 257/99 |
| 2013/0207156 A1* | 8/2013 | Moosburger | H01L 31/153 |
| | | | 257/99 |
| 2015/0014716 A1* | 1/2015 | von Malm | H01L 27/15 |
| | | | 257/89 |
| 2016/0211417 A1* | 7/2016 | Katsuno | H01L 33/405 |

(Continued)

FOREIGN PATENT DOCUMENTS

| | | |
|---|---|---|
| JP | 2016-174018 A | 9/2016 |
| JP | 2017-011016 A | 1/2017 |

(Continued)

*Primary Examiner* — Mark W Tornow
*Assistant Examiner* — Priya M Rampersaud
(74) *Attorney, Agent, or Firm* — Foley & Lardner LLP

(57) ABSTRACT

A light-emitting element includes: a base member including a first side and a second side, the first side and the second side being along a first direction, wherein a second direction from the first side toward the second side is orthogonal to the first direction; a semiconductor stacked body that is not electrically connected to the base member in a third direction, the third direction being orthogonal to a plane including the first direction and the second direction, the semiconductor stacked body comprising a p-type semiconductor layer, a light-emitting layer, and an n-type semiconductor layer; a first pad electrode that is not electrically connected to the base member in the third direction; a second pad electrode that is not electrically connected to the base member in the third direction; a first conductive layer; and a second conductive layer.

15 Claims, 8 Drawing Sheets

(56) References Cited

U.S. PATENT DOCUMENTS

2016/0276540 A1 9/2016 Miyabe et al.
2016/0372627 A1 12/2016 Sawano et al.

FOREIGN PATENT DOCUMENTS

| JP | 2017-055020 A | 3/2017 | | |
|----|---------------|--------|---|---|
| WO | WO-2009106063 A1 | * | 9/2009 | ........... H01L 33/382 |
| WO | WO-2012/022657 A1 | | 2/2012 | |

* cited by examiner

LIGHT-EMITTING ELEMENT

CROSS-REFERENCE TO RELATED APPLICATION

This application claims priority to Japanese Patent Application No. 2018-223650, filed on Nov. 29, 2018, the disclosure of which is hereby incorporated by reference in its entirety.

BACKGROUND

The disclosure relates to a light-emitting element.

Among light-emitting elements, there is a light-emitting device having a structure in which a semiconductor stacked body includes an n-type semiconductor layer, a p-type semiconductor layer, and a light-emitting layer provided between the n-type semiconductor layer and the p-type semiconductor layer; and light is extracted from the n-type semiconductor layer surface side which is on the side opposite to the surface where the light-emitting layer and the p-type semiconductor layer are stacked. For example, JP-A 2017-11016 (Kokai) discloses a structure of such a light-emitting element in which an n-side pad electrode and a p-side pad electrode that perform electrical connections to the outside are disposed in a region not overlapping the light extraction surface in a top view.

SUMMARY

According to certain embodiments described in the present disclosure, a light-emitting element is provided in which the concentration of the current density in a region proximate to the pad electrodes can be suppressed.

In one embodiment, a light-emitting element includes a base member including a first side and a second side, the first side being along a first direction, the second side being along the first direction, a second direction from the first side toward the second side being orthogonal to the first direction; a semiconductor stacked body not electrically connected to the base member in a third direction, the third direction being orthogonal to a plane including the first direction and the second direction, the semiconductor stacked body including a p-type semiconductor layer, a light-emitting layer, and an n-type semiconductor layer in order from the base member side; a first pad electrode not electrically connected to the base member in the third direction, the first pad electrode being between the first side and the semiconductor stacked body in the second direction; a second pad electrode not electrically connected to the base member in the third direction, the second pad electrode being between the first side and the semiconductor stacked body in the second direction, the second pad electrode being adjacent to the first pad electrode; a first conductive layer electrically connecting the n-type semiconductor layer and the first pad electrode; and a second conductive layer electrically connecting the p-type semiconductor layer and the second pad electrode. The n-type semiconductor layer includes a plurality of first island-shaped contact regions and a second side contact region. The plurality of first island-shaped contact regions contact the first conductive layer, the second side contact region located at an outer perimeter portion of the n-type semiconductor layer and contact the first conductive layer. The plurality of first island-shaped contact regions are between the first pad electrode and the second side contact region in the second direction.

According to certain embodiments of the light-emitting element, the concentration of the current density in a region proximate to the pad electrodes can be suppressed.

DETAILED DESCRIPTION

Figure 1:
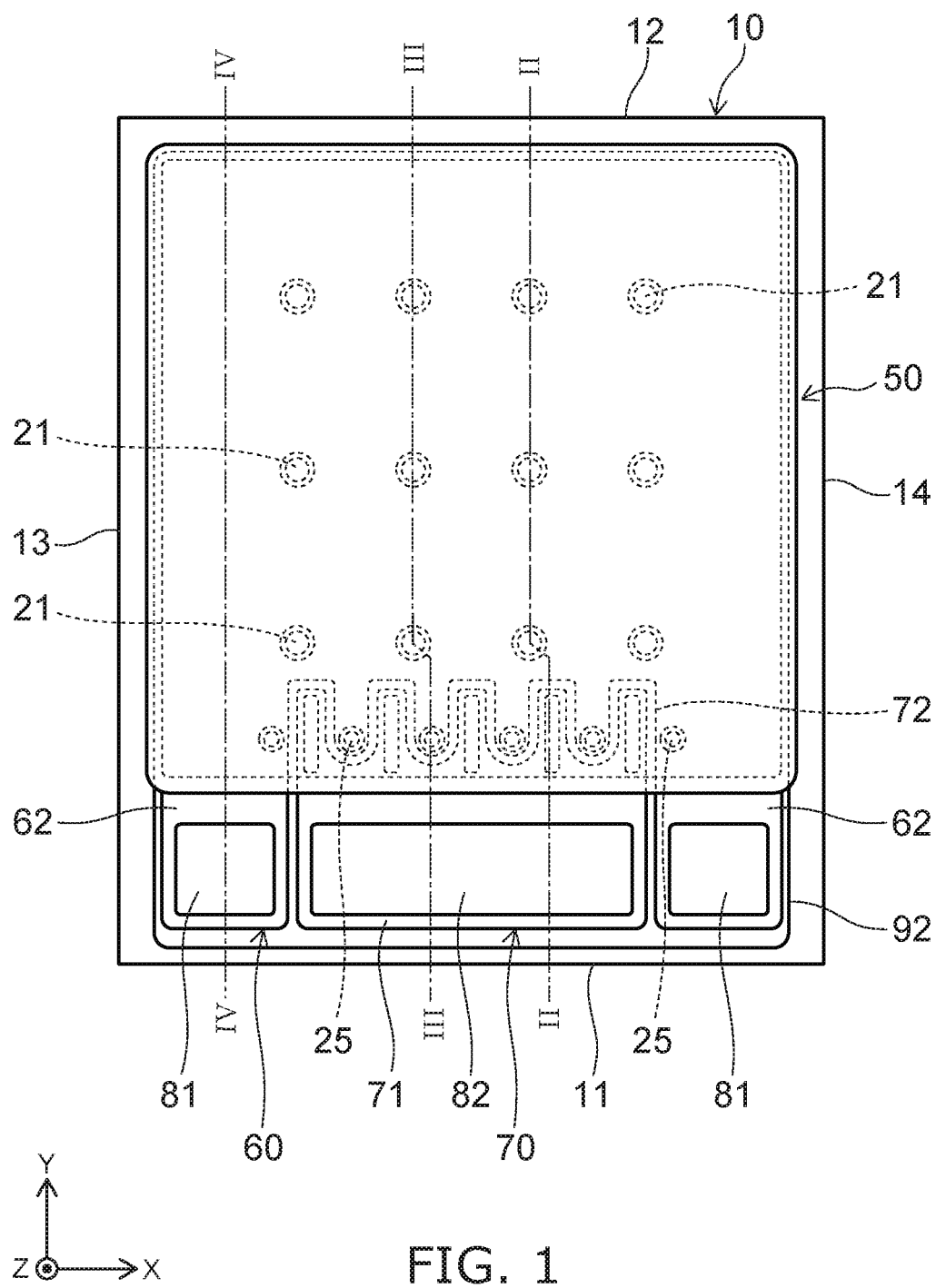
FIG. 1 is a schematic plan view of a light-emitting element of one embodiment of the invention.

Embodiments will now be described with reference to the drawings. The same components in the drawings are marked with the same reference numerals.

Figure 2:
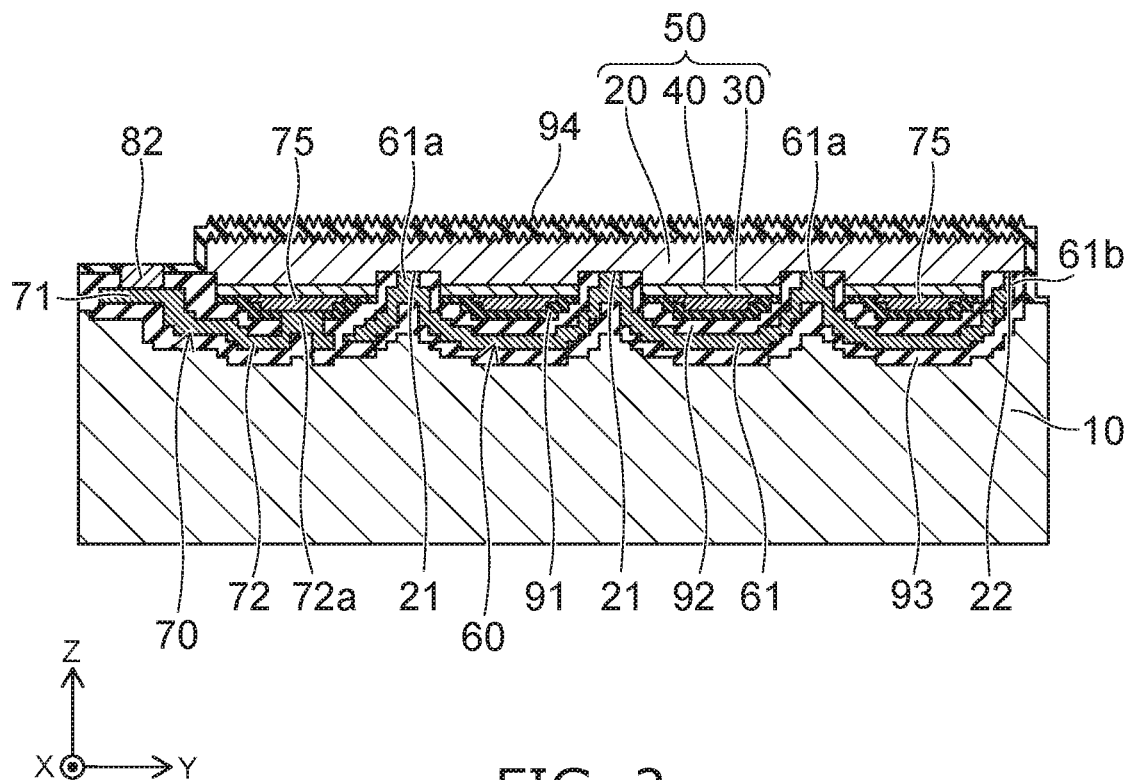
FIG. 2 is a II-II schematic cross-sectional view of the light-emitting element depicted in FIG. 1.
Figure 3:
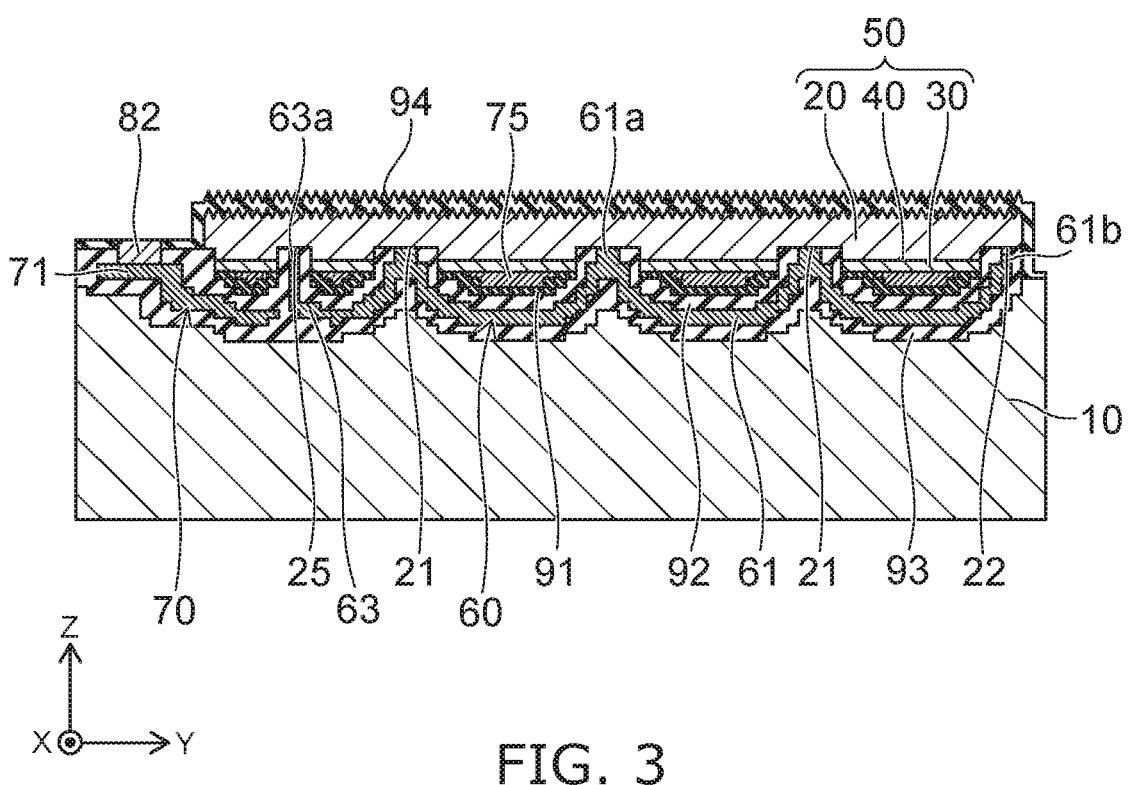
FIG. 3 is a III-III schematic cross-sectional view of the light-emitting element depicted in FIG. 1.
Figure 4:
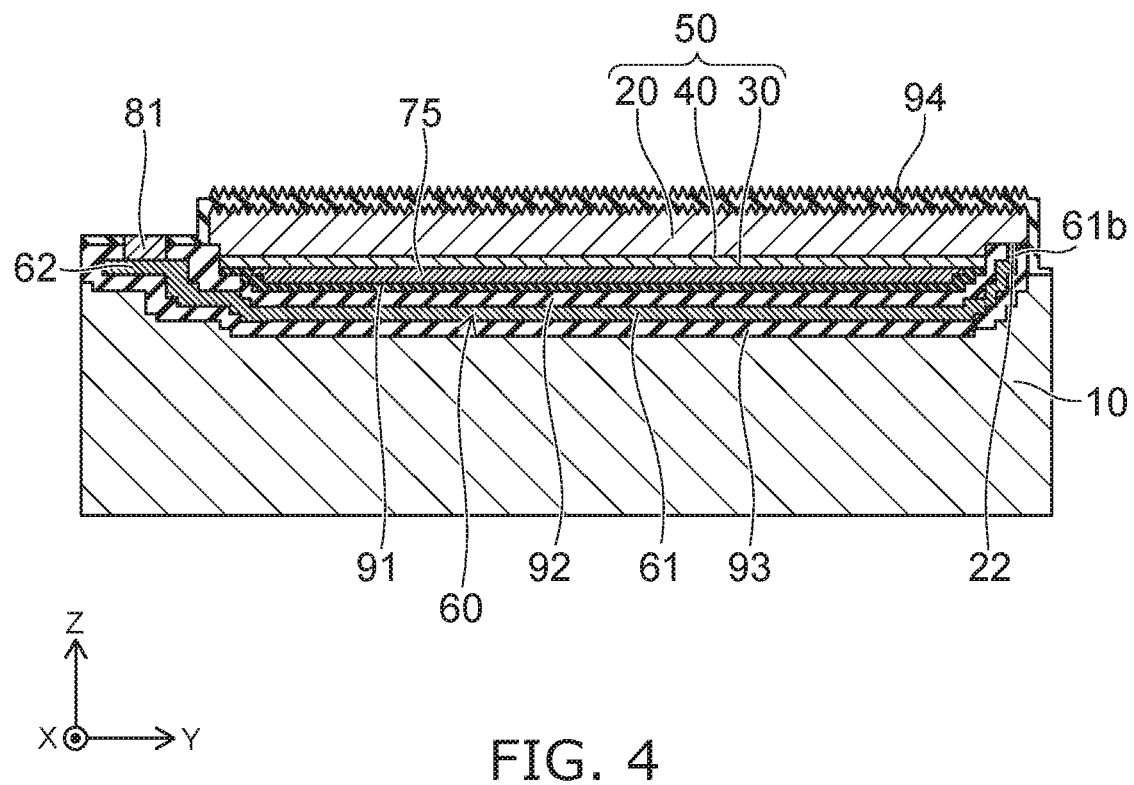
FIG. 4 is a IV-IV schematic cross-sectional view of the light-emitting element depicted in FIG. 1.

FIG. 1 is a schematic plan view of a light-emitting element of one embodiment. FIG. 2 is a II-II schematic cross-sectional view of FIG. 1. FIG. 3 is a III-III schematic cross-sectional view of FIG. 1. FIG. 4 is a IV-IV schematic cross-sectional view of FIG. 1.

FIG. 1 corresponds to a top view of the light-emitting element (other than a protective film 94) of FIG. 2 to FIG. 4 when viewed from above. FIG. 6 to FIG. 9 described below correspond to plan views of the members on a base member 10 as viewed from the base member 10 side. Although the members on the base member 10 are covered with the base member 10, the base member 10 is illustrated only as an outline.

The light-emitting element of the embodiment includes the base member 10, a semiconductor stacked body 50, a first conductive layer 60, a second conductive layer 70, a first pad electrode 81, and a second pad electrode 82. The base member 10 supports the semiconductor stacked body 50, the first conductive layer 60, the second conductive layer 70, the first pad electrode 81, and the second pad electrode 82.

In a top view as shown in FIG. 1, the periphery of the base member 10 is formed in a rectangular configuration and includes a first side 11, a second side 12, a third side 13, and a fourth side 14.

The first side 11 and the second side 12 are aligned with an X-direction (a first direction). The direction from the first side 11 toward the second side 12 is aligned with a Y-direction (a second direction) orthogonal to the X-direction. The third side 13 and the fourth side 14 are aligned with the Y-direction. The direction from the third side 13 toward the fourth side 14 is aligned with the X-direction.

As shown in FIG. 2 to FIG. 4, the semiconductor stacked body 50 is provided on the base member 10. The semiconductor stacked body 50 is separated from the base member 10 in a Z-direction (a third direction) and is not electrically connected to the base member 10. For example, the semiconductor stacked body 50 is provided on the base member 10 with an insulating layer interposed therebetween. The Z-direction is orthogonal to a plane including the X-direction and the Y-direction.

Figure 5:
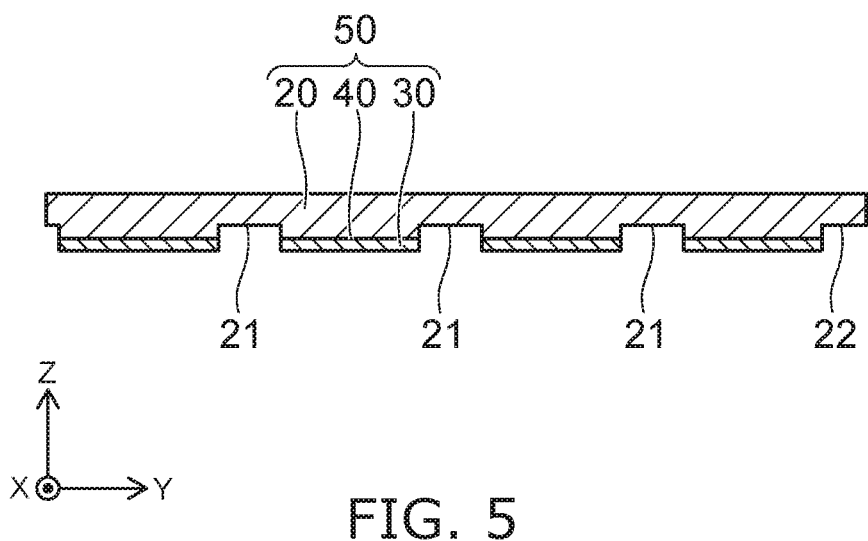
FIG. 5 is a schematic cross-sectional view of a semiconductor stacked body of the light-emitting element of one embodiment of the invention.

FIG. 5 is a schematic cross-sectional view of the semiconductor stacked body 50 of the II-II cross section of FIG. 1.

The semiconductor stacked body 50 includes an n-type semiconductor layer 20, a p-type semiconductor layer 30, and a light-emitting layer 40 provided between the n-type semiconductor layer 20 and the p-type semiconductor layer 30. For example, a nitride semiconductor such as $In_XAl_YGa_{1-X-Y}N$ ($0 \leq X$, $0 \leq Y$, and $X+Y<1$) or the like is used favorably as the semiconductor stacked body 50.

As shown in FIG. 2, the p-type semiconductor layer 30, the light-emitting layer 40, and the n-type semiconductor layer 20 are provided in order from the base member 10 side.

For example, the n-type semiconductor layer 20, the light-emitting layer 40, and the p-type semiconductor layer 30 are epitaxially grown in order on a growth substrate. Subsequently, a portion of the n-type semiconductor layer 20 is exposed from under the p-type semiconductor layer 30 and the light-emitting layer 40 by removing a portion of the stacked portion of the p-type semiconductor layer 30 and the light-emitting layer 40 by etching. The cross-sectional configuration of the p-type semiconductor layer 30 and the light-emitting layer 40 remains in a mesa configuration.

A third conductive layer 75 is provided on the surface of the p-type semiconductor layer 30 on the side opposite to the surface where the light-emitting layer 40 is stacked. The third conductive layer 75 includes, for example, a reflective layer including at least one selected from the group consisting of Ag and Al. The third conductive layer 75 also may have a stacked structure including a reflective layer and a metal layer including at least one selected from the group consisting of Ni, Ti, and Pt. For example, the third conductive layer 75 may have a stacked structure in which Ag, Ni, Ti, and Pt are stacked in order from the p-type semiconductor layer 30 side.

Figure 6:
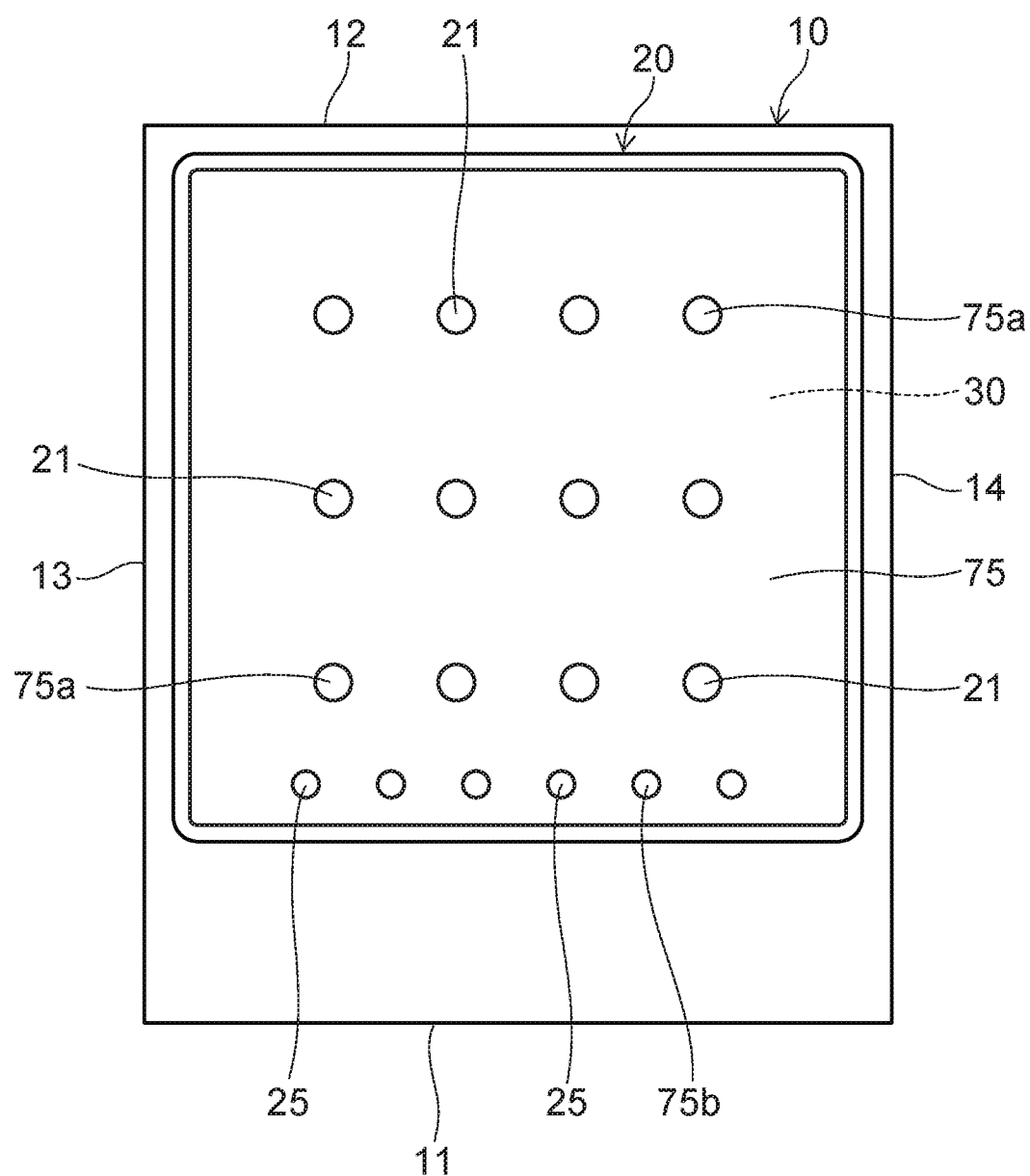
FIG. 6 is a schematic plan view of the light-emitting element of one embodiment of the invention.

FIG. 6 is a schematic plan view illustrating the arrangement of the n-type semiconductor layer 20 and the third conductive layer 75.

In a top view, the periphery of the n-type semiconductor layer 20 is formed in a rectangular configuration including four sides along the four sides (the first side 11, the second side 12, the third side 13, and the fourth side 14) of the base member 10. The n-type semiconductor layer 20 includes multiple first island-shaped contact regions 21 and multiple second island-shaped contact regions 25 inward of the four sides.

The third conductive layer 75 has multiple first openings 75a and multiple second openings 75b. The first openings 75a expose the first island-shaped contact regions 21 of the n-type semiconductor layer 20. The second openings 75b expose the second island-shaped contact regions 25 of the n-type semiconductor layer 20. In a top view, the multiple first openings 75a are arranged in a matrix configuration. In a top view, the multiple second openings 75b are arranged in a linear configuration outward of the first openings 75a.

The multiple first island-shaped contact regions 21 are arranged along the X-direction and the Y-direction. The multiple second island-shaped contact regions 25 are arranged along the X-direction. The density of the multiple second island-shaped contact regions 25 is higher than the density of the multiple first island-shaped contact regions 21. In a top view, the surface area of one of the second island-shaped contact regions 25 is smaller than the surface area of one of the first island-shaped contact regions 21.

As shown in FIG. 2, an insulating layer 91 covers the third conductive layer 75. The insulating layer 91 is, for example, a silicon nitride layer. An insulating layer 92 covers the insulating layer 91 and the surface of the semiconductor stacked body 50 on the side where the mesa portion (the stacked portion of the p-type semiconductor layer 30 and the light-emitting layer 40) is formed. The insulating layer 92 is, for example, a silicon oxide layer.

Figure 7:
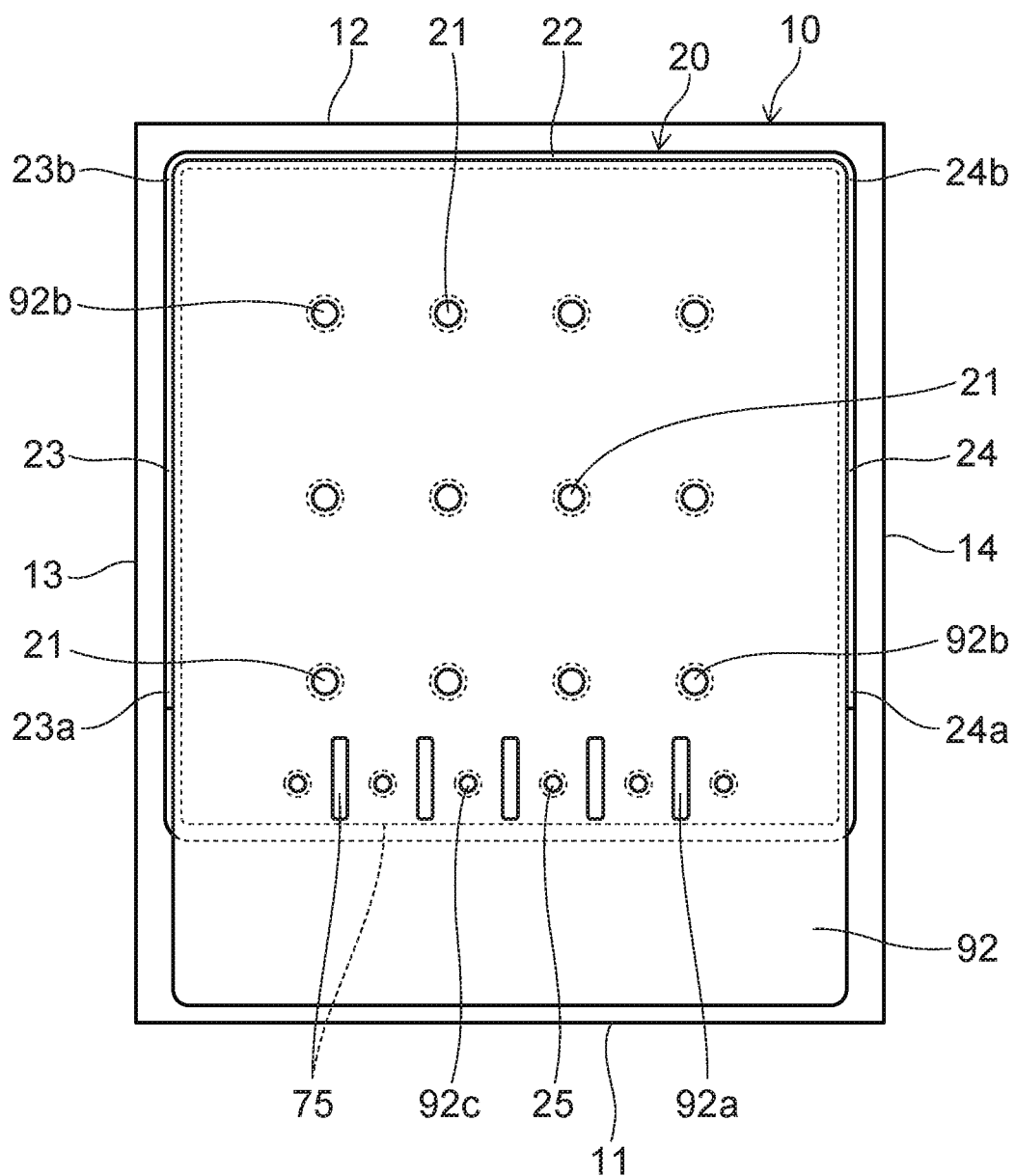
FIG. 7 is a schematic plan view of the light-emitting element of one embodiment of the invention.

FIG. 7 is a schematic plan view illustrating mainly the arrangement of the n-type semiconductor layer 20 and the insulating layer 92.

The insulating layer 92 has multiple first openings 92b, multiple second openings 92c, and multiple third openings 92a. The first openings 92b expose the first island-shaped contact regions 21 of the n-type semiconductor layer 20. The second openings 92c expose the second island-shaped contact regions 25 of the n-type semiconductor layer 20. The third openings 92a expose the third conductive layer 75. In a top view, a portion of the first openings 92b, the second openings 92c, and the third openings 92a overlaps the first island-shaped contact regions 21.

The n-type semiconductor layer 20 further includes a second side contact region 22, a third side contact region 23, and a fourth side contact region 24.

At the outer perimeter portion of the n-type semiconductor layer 20, at least a portion of the second side contact region 22 extends along the X-direction, and at least a portion of the third side contact region 23 and at least a portion of the fourth side contact region 24 extend along the Y-direction. For example, the second side contact region 22 and the third side contact region 23 are disposed to be continuous, and the second side contact region 22 and the fourth side contact region 24 are disposed to be continuous.

The first island-shaped contact regions 21 are between the second side contact region 22 and the second island-shaped contact regions 25 in the Y-direction. In other words, in the Y-direction, the positions of the first island-shaped contact regions 21 are between the position of the second side contact region 22 and the positions of the second island-shaped contact regions 25.

The first island-shaped contact regions 21 are between the third side contact region 23 and the fourth side contact region 24 in the X-direction. In other words, in the X-direction, the positions of the first island-shaped contact regions 21 are between the position of the third side contact region 23 and the position of the fourth side contact region 24.

As shown in FIG. 2 to FIG. 4 and FIG. 8, the first conductive layer 60 and the second conductive layer 70 are provided on the insulating layer 92. The first conductive layer 60 and the second conductive layer 70 are separated from the base member 10 in the Z-direction and are not electrically connected to the base member 10. For example, the first conductive layer 60 and the second conductive layer 70 are provided on the base member 10 with an insulating film 93 interposed therebetween.

Figure 9:
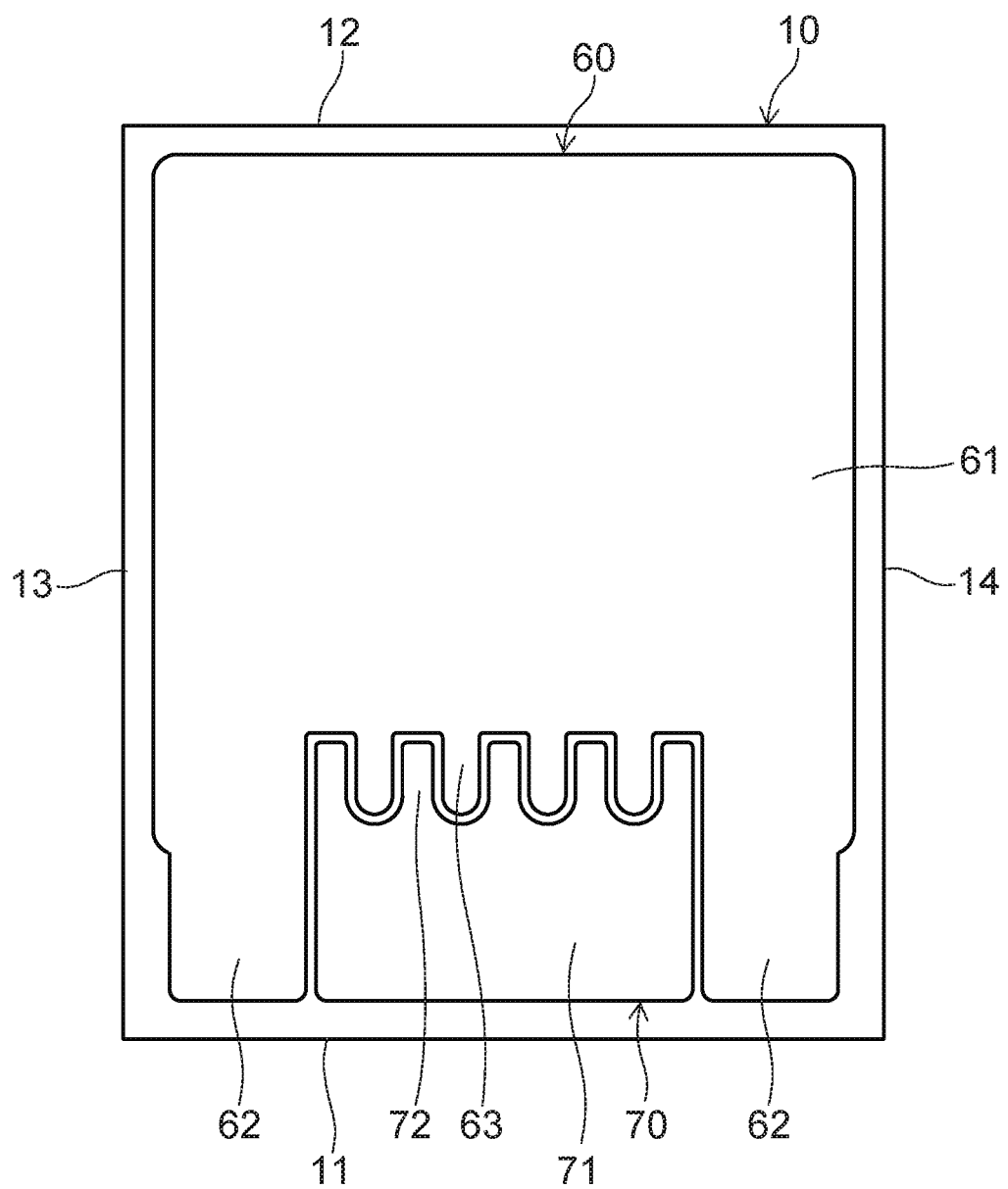
FIG. 9 is a schematic plan view of the light-emitting element of one embodiment of the invention.
Figure 9:
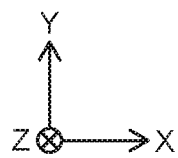

FIG. 9 is a schematic plan view illustrating the arrangement of the first conductive layer 60 and the second conductive layer 70 with respect to the base member 10.

The first conductive layer 60 and the second conductive layer 70 are formed simultaneously using the same metal material. The first conductive layer 60 and the second conductive layer 70 include, for example, at least one selected from the group consisting of Al and Cu. The first conductive layer 60 and the second conductive layer 70 do not overlap each other in the Z-direction.

The first conductive layer 60 includes a first n-side portion 61, a second n-side portion 62, and a third n-side portion 63. The second conductive layer 70 includes a first p-side portion 71 and a second p-side portion 72.

The first conductive layer 60 includes, for example, two second n-side portions 62. The second conductive layer 70 is provided between the two second n-side portions 62 in the X-direction.

Figure 8:
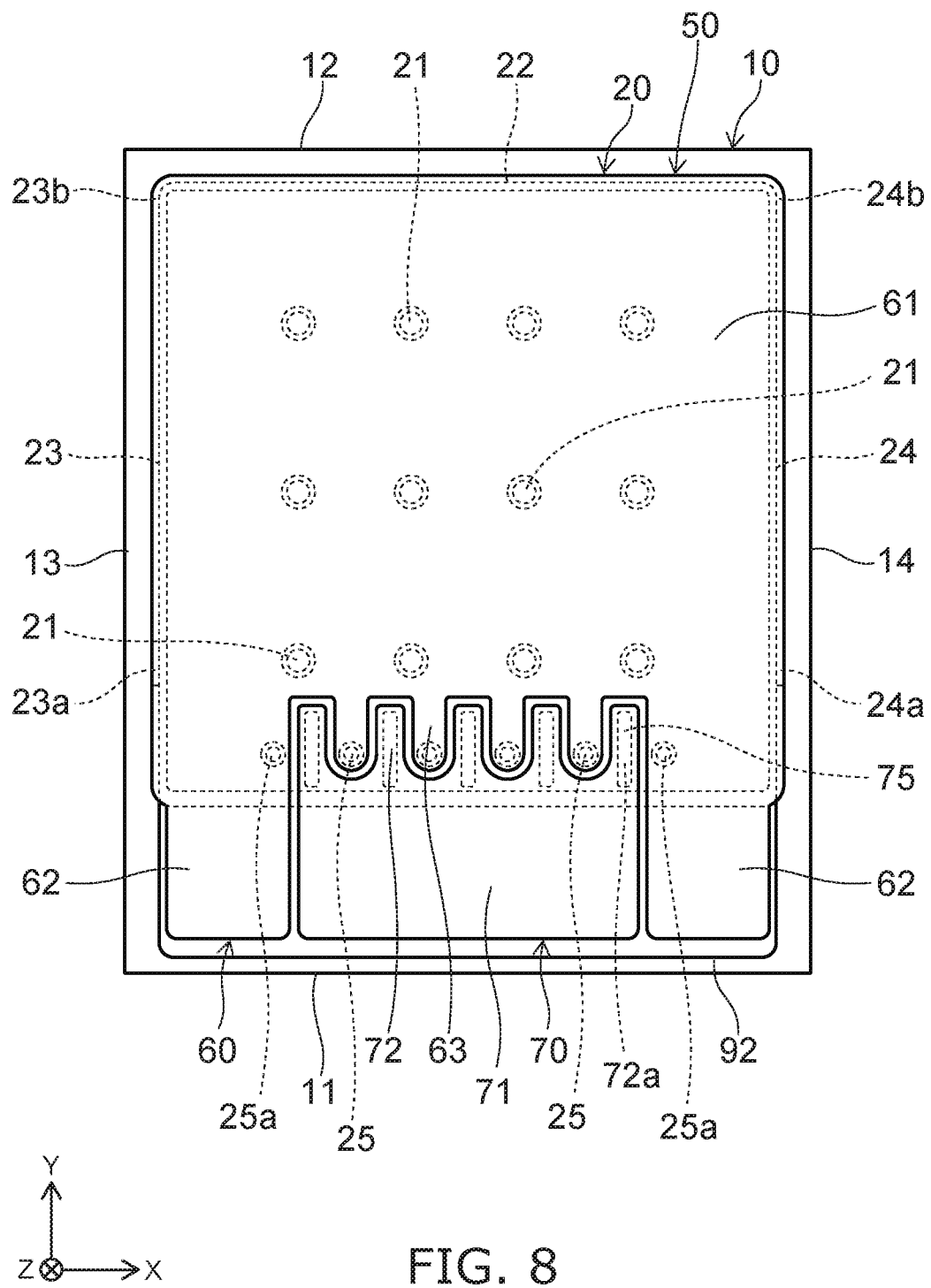
FIG. 8 is a schematic plan view of the light-emitting element of one embodiment of the invention.

As shown in FIG. 8, the first n-side portion 61 of the first conductive layer 60 is provided in a region overlapping the semiconductor stacked body 50. The second n-side portion 62 extends from the first n-side portion 61 toward the first side 11 of the base member 10. As shown in FIG. 4, a portion of the second n-side portion 62 is disposed in a region not overlapping the semiconductor stacked body 50 in the Z-direction.

As shown in FIG. 2 and FIG. 3, portions (n-contact portions) 61a of the first n-side portion 61 contact the first island-shaped contact regions 21 of the n-type semiconductor layer 20. Another portion (an n-contact portion) 61b of the first n-side portion 61 contacts the second side contact region 22 of the n-type semiconductor layer 20. Similarly, other portions (n-contact portions) of the first n-side portion 61 contact the third side contact region 23 and the fourth side contact region 24 of the n-type semiconductor layer 20.

As shown in FIG. 8, the first conductive layer 60 includes multiple third n-side portions 63 extending from the first n-side portion 61 toward the first side 11 of the base member 10. In the Z-direction, the third n-side portions 63 overlap a portion of the second island-shaped contact regions 25 of the multiple second island-shaped contact regions 25. As shown in FIG. 3, portions (n-contact portions) 63a of the third n-side portions 63 contact the second island-shaped contact regions 25 of the n-type semiconductor layer 20.

As shown in FIG. 8, in the Z-direction, the multiple second island-shaped contact regions 25 include second island-shaped contact regions 25a overlapping the first n-side portion 61 of the first conductive layer 60 and contacting the first n-side portion 61. In the embodiment, two second island-shaped contact regions 25a that are disposed at the two ends of the multiple second island-shaped contact regions 25 arranged in a linear configuration in the X-direction are disposed at positions overlapping the first n-side portion 61.

The first conductive layer 60 is connected electrically to the n-type semiconductor layer 20 by the contact between the n-type semiconductor layer 20 and the n-contact portions of the first conductive layer 60 recited above.

As shown in FIG. 8, the second conductive layer 70 includes multiple second p-side portions 72. The multiple second p-side portions 72 extend toward the first n-side portion 61 of the first conductive layer 60 from the first p-side portion 71.

The second p-side portions 72 shown in FIG. 8 overlap the third conductive layer 75 exposed in the third openings 92a of the insulating layer 92 shown in FIG. 7. As shown in FIG. 2, portions (p-contact portions) 72a of the second p-side portions 72 pierce the insulating layer 92 and the insulating layer 91 and contact the third conductive layer 75.

In other words, the third conductive layer 75 is provided between the p-type semiconductor layer 30 and the second p-side portions 72 and electrically connects the second conductive layer 70 and the p-type semiconductor layer 30.

In a top view as shown in FIG. 8, one second p-side portion 72 is between two third n-side portions 63 adjacent to each other in the X-direction. In other words, one second p-side portion 72 is between two second island-shaped contact regions 25 adjacent to each other in the X-direction. Also, one second island-shaped contact region 25 is between two second p-side portions 72 adjacent to each other in the X-direction. In other words, in a top view, the second island-shaped contact regions 25 and the second p-side portions 72 are arranged alternately along the X-direction.

As shown in FIG. 8, the third side contact region 23 of the n-type semiconductor layer 20 includes a first end portion 23a positioned at the first side 11 side of the base member 10, and a second end portion 23b positioned at the second side 12 side of the base member 10. In a top view, the first end portion 23a is between the second end portion 23b and the second p-side portions 72 of the second conductive layer 70 in the Y-direction. In other words, in the Y-direction, the position of the first end portion 23a is between the position of the second end portion 23b and the positions of the second p-side portions 72.

As shown in FIG. 8, the fourth side contact region 24 of the n-type semiconductor layer 20 includes a first end portion 24a positioned toward the first side 11 side of the base member 10, and a second end portion 24b positioned toward the second side 12 side of the base member 10. In a top view, the first end portion 24a is between the second end portion 24b and the second p-side portions 72 of the second conductive layer 70 in the Y-direction. In other words, in the Y-direction, the position of the first end portion 24a is between the position of the second end portion 24b and the positions of the second p-side portions 72.

As shown in FIG. 1, the first pad electrode 81 is disposed at the second n-side portion 62 of the first conductive layer 60, and the second pad electrode 82 is disposed at the first p-side portion 71 of the second conductive layer 70. The first pad electrode 81 contacts the second n-side portion 62, and the second pad electrode 82 contacts the first p-side portion 71. The first pad electrode 81 and the second pad electrode 82 include, for example, at least one selected from the group consisting of Ti, Pt, and Au. For example, the first pad electrode 81 and the second pad electrode 82 may have stacked structures in which Ti, Pt, and Au are stacked in order from the semiconductor stacked body 50 side.

As shown in FIG. 2 and FIG. 3, the second pad electrode 82 is disposed in a region not overlapping the semiconductor stacked body 50 in the Z-direction, and the direction from the first p-side portion 71 of the second conductive layer 70 toward the second pad electrode 82 is aligned with the Z-direction. The direction from the second p-side portions 72 of the second conductive layer 70 toward the semiconductor stacked body 50 is aligned with the Z-direction. In the Z-direction, the second pad electrode 82 is separated from the base member 10 and is not electrically connected to the base member 10. For example, the second pad electrode 82 is provided on the base member 10 with the insulating layer 93 interposed therebetween.

As shown in FIG. 4, the first pad electrode 81 is disposed in a region not overlapping the semiconductor stacked body 50, and the direction from the second n-side portion 62 of the first conductive layer 60 toward the first pad electrode 81 is aligned with the Z-direction. The direction from the first n-side portion 61 of the first conductive layer 60 toward the semiconductor stacked body 50 is aligned with the Z-direction. In the Z-direction, the first pad electrode 81 is separated from the base member 10 and is not electrically connected to the base member 10. For example, the first pad electrode 81 is provided on the base member 10 with the insulating layer 93 interposed therebetween.

In a top view as shown in FIG. 1, the first pad electrode 81 and the second pad electrode 82 are between the semiconductor stacked body 50 and the first side 11 of the base member 10 in the Y-direction. In other words, in the Y-direction, the position of the first pad electrode 81 and the position of the second pad electrode 82 are between the position of the first side 11 of the base member 10 and the position of the semiconductor stacked body 50.

The first pad electrode 81 and the second pad electrode 82 are adjacent to each other in the X-direction. In other words, the direction from the first pad electrode 81 toward the second pad electrode 82 is aligned with the X-direction. Multiple (e.g., two) first pad electrodes 81 are provided at the outer edge vicinity of the base member 10, and the second pad electrode 82 is between the multiple first pad electrodes 81 in the X-direction.

As shown in FIG. 2 to FIG. 4, the insulating layer 93 is provided between the first conductive layer 60 and the base member 10 and between the second conductive layer 70 and the base member 10. The insulating layer 93 covers the first conductive layer 60 and the second conductive layer 70. The insulating layer 93 is, for example, a silicon oxide layer, electrically insulates between the first conductive layer 60 and the base member 10, and electrically insulates between the second conductive layer 70 and the base member 10.

The surface of the n-type semiconductor layer 20 on the side opposite to the surface where the light-emitting layer 40 and the p-type semiconductor layer 30 are stacked is roughened. The protective film 94 covers this surface. An unevenness is also formed in the surface of the protective film 94. The protective film 94 also covers the side surface of the n-type semiconductor layer 20.

According to the light-emitting element of the embodiment described above, the n-side first pad electrode 81 that is electrically connected to the n-type semiconductor layer 20 and the p-side second pad electrode 82 that is electrically connected to the p-type semiconductor layer 30 are disposed between the semiconductor stacked body 50 and the first side 11 of the base member 10 in a top view. In other words, at one side (the first side 11) of the four sides of the base member 10, the first pad electrode 81 is disposed on the n-side, or the second pad electrode 82 is disposed on the p-side.

For example, compared to a reference example in which the first pad electrode 81 and the second pad electrode 82 are arranged with the semiconductor stacked body 50 interposed therebetween in a top view, for the same light emission surface area, the planar size of the entire light-emitting element of such a structure can be smaller than that of the reference example. Also, for the same planar size of the entire light-emitting element, the light emission surface area can be greater than that of the reference example.

The concentration of the current density at the first side 11 side can be suppressed because the second side contact region 22 that is electrically connected to the first pad electrode 81 is disposed proximate to the second side 12, the second side 12 being opposite the first side 11 where the first pad electrode 81 is disposed. The bias of the light emission intensity distribution in the light-emitting surface can be suppressed thereby. Also, the shorter life of the light-emitting element due to the concentration of the current density at the vicinity of the region where the first pad electrode 81 and the second pad electrode 82 are disposed can be suppressed.

Also, because the third side contact region 23 that is electrically connected to the first pad electrode 81 is disposed at a position proximate to the third side 13 of the base member 10, and the fourth side contact region 24 that is electrically connected to the first pad electrode 81 is disposed at a position proximate to the fourth side 14, the distribution of the current density in the surface of the semiconductor stacked body 50 can be more uniform, and the light emission intensity distribution in the surface can be more uniform.

As shown in FIG. 8, because, in the Y-direction, the position of the first end portion 23a of the third side contact region 23 is closer to the second side 12 than are the positions of the tip portions of the second p-side portions 72, and because a distance is provided between the two, insulation defects between the first end portion 23a of the third side contact region 23 and the tip portions of the second p-side portions 72 due to migration of the metal material included in the third conductive layer 75 can be suppressed.

Similarly, because, in the Y-direction, the position of the first end portion 24a of the fourth side contact region 24 is closer to the second side 12 than are the positions of the tip portions of the second p-side portions 72, insulation defects between the first end portion 24a of the fourth side contact region 24 and the tip portions of the second p-side portions 72 due to migration can be suppressed.

Because a position of one of the two first pad electrodes 81 is closer to the third side 13 than is a position of the second pad electrode 82, and because a position of the other of the two first pad electrodes 81 is closer to the fourth side 14 than is a position of the second pad electrode 82, the current density distribution between the third side contact region 23 and the first pad electrode 81 and the current density distribution between the fourth side contact region 24 and the first pad electrode 81 can be laterally symmetric in the X-direction. Thereby, the bias of the current density distribution at the vicinity of the region where the first pad electrodes 81 and the second pad electrode 82 are disposed is suppressed, and the light emission intensity distribution in the surface is more uniform.

Figure 10:
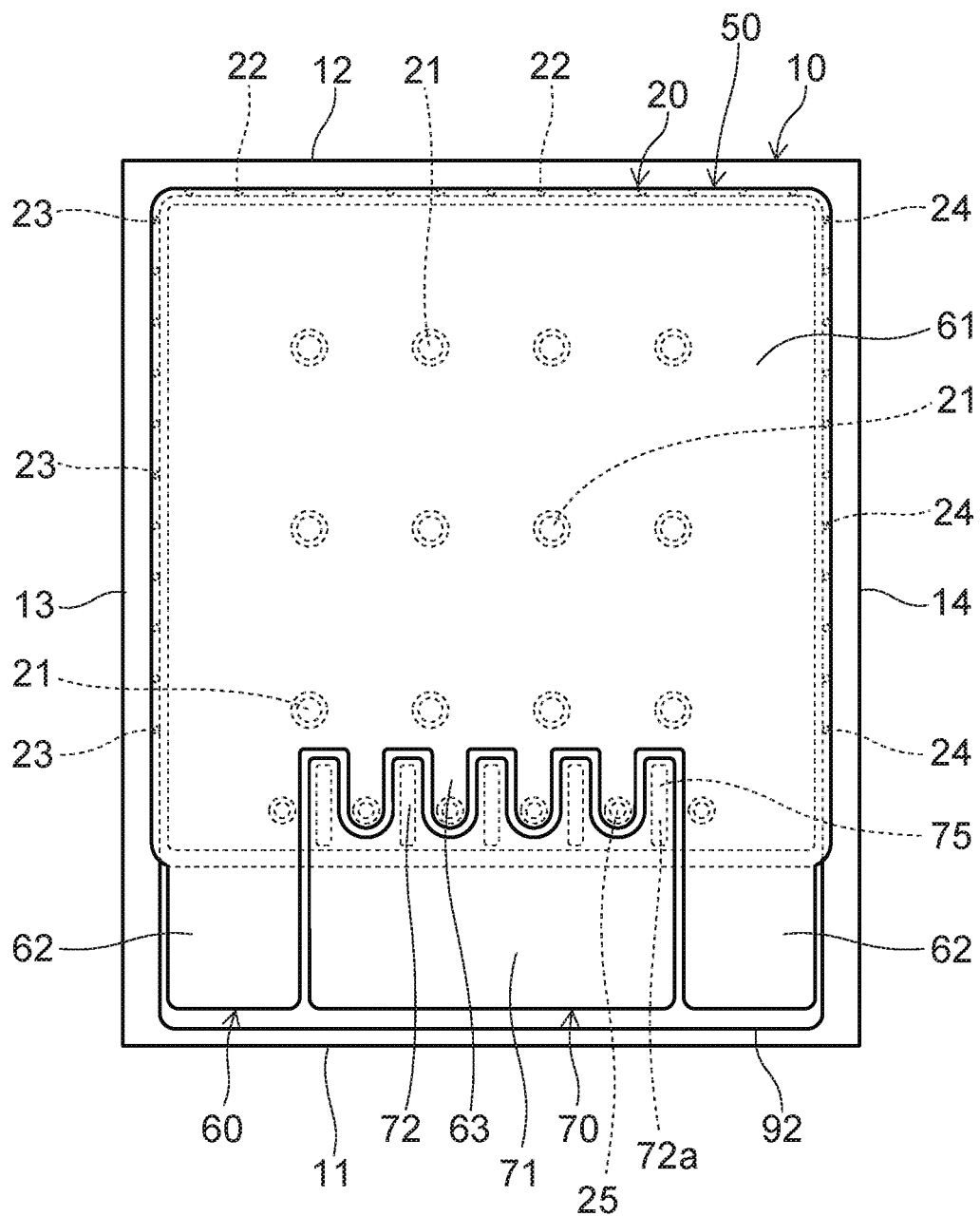
FIG. 10 is a schematic plan view of the light-emitting element of one embodiment of the invention.

As shown in FIG. 10, the third side contact region 23 is not limited to a continuous line configuration, and multiple third side contact regions 23 having island configurations may be arranged along the third side 13. In other words, the direction from one of the multiple third side contact regions 23 toward another one of the multiple third side contact regions 23 is aligned with the Y-direction.

Similarly, the fourth side contact region 24 is not limited to a continuous line configuration, and multiple fourth side contact regions 24 having island configurations may be arranged along the fourth side 14. In other words, the direction from one of the multiple fourth side contact regions 24 toward another one of the multiple fourth side contact regions 24 is aligned with the Y-direction.

Similarly, the second side contact region 22 is not limited to a continuous line configuration, and multiple second side contact regions 22 having island configurations may be arranged along the second side 12. In other words, the direction from one of the multiple second side contact regions 22 toward another one of the multiple second side contact regions 22 is aligned with the X-direction.

Proximate to the first side 11 in the surface of the semiconductor stacked body 50, the p-side contact portions that are portions of the second conductive layer 70 connected to the p-type semiconductor layer 30 via the third conductive layer 75 are disposed, which causes size and/or layout constraints of the n-side contact portions.

According to embodiments of the disclosure, the multiple second island-shaped contact regions 25 are arranged along the X-direction adjacent to the multiple second p-side portions 72. Due to the constraint of one of the second island-shaped contact regions 25 being disposed between two mutually-adjacent second p-side portions 72, there are cases where the surface area of the second island-shaped contact region 25 in a top view is less than the surface area of the first island-shaped contact region 21 in the top view. Even in such a case, by arranging the multiple second island-shaped contact regions 25 at a higher density than the multiple first island-shaped contact regions 21, the total n-side contact portion surface area proximate to the first side 11 can be increased.

The embodiments of the present disclosure have been described with reference to specific examples. However, the present disclosure is not limited to these specific examples. Based on the above-described embodiments of the present disclosure, all embodiments that can be implemented with appropriately design modification by one skilled in the art are also within the scope of the present disclosure as long as the gist of the present disclosure is included. Besides, within the scope of the spirit of the present disclosure, one skilled in the art can conceive various modifications, and the modifications fall within the scope of the present disclosure.

What is claimed is:

1. A light-emitting element comprising:
a base member including a first side and a second side, the first side being along a first direction, the second side being along the first direction, wherein a second direction from the first side toward the second side is orthogonal to the first direction;
a semiconductor stacked body that is not electrically connected to the base member in a third direction, the third direction being orthogonal to a plane including the first direction and the second direction, the semiconductor stacked body comprising a p-type semiconductor layer, a light-emitting layer, and an n-type semiconductor layer in order from a base member side;
a first pad electrode that is not electrically connected to the base member in the third direction, wherein the first pad electrode is between the first side and the semiconductor stacked body in the second direction;
a second pad electrode that is not electrically connected to the base member in the third direction, wherein the second pad electrode is between the first side and the semiconductor stacked body in the second direction, and the second pad electrode is adjacent to the first pad electrode;
a first conductive layer electrically connecting the n-type semiconductor layer and the first pad electrode; and
a second conductive layer electrically connecting the p-type semiconductor layer and the second pad electrode;
wherein the n-type semiconductor layer comprises:
a plurality of first island-shaped contact regions contacting the first conductive layer, and
a second side contact region located at an outer perimeter portion of the n-type semiconductor layer and contacting the first conductive layer; and
wherein the plurality of first island-shaped contact regions are between the first pad electrode and the second side contact region in the second direction.

2. The light-emitting element according to claim 1, wherein:
in a top view, a periphery of the n-type semiconductor layer is rectangular; and
at least a portion of the second side contact region is aligned with the first direction.

3. The light-emitting element according to claim 1, wherein:
the n-type semiconductor layer further comprises a plurality of second island-shaped contact regions contacting the first conductive layer;
the plurality of first island-shaped contact regions are between the second side contact region and the plurality of second island-shaped contact regions in the second direction; and
a density of the plurality of second island-shaped contact regions is higher than a density of the plurality of first island-shaped contact regions.

4. The light-emitting element according to claim 3, wherein a direction from one of the plurality of second island-shaped contact regions toward at least a portion of the second conductive layer is aligned with the first direction.

5. The light-emitting element according to claim 3, wherein a portion of the second conductive layer is between a first of the plurality of second island-shaped contact regions and a second of the plurality of second island-shaped contact regions in the first direction.

6. The light-emitting element according to claim 1, wherein:
the n-type semiconductor layer further includes at least one second island-shaped contact region contacting the first conductive layer;
the plurality of first island-shaped contact regions are between the second side contact region and the at least one second island-shaped contact region in the second direction; and
in a top view, a surface area of at least one of the second island-shaped contact regions is greater than a surface area of at least one of the plurality of first island-shaped contact regions.

7. The light-emitting element according to claim 1, wherein:
the base member further comprises a third side and a fourth side, the third side being along the second direction, the fourth side being along the second direction, wherein a direction from the third side toward the fourth side is aligned with the first direction;
the n-type semiconductor layer further comprises a third side contact region and a fourth side contact region located at the outer perimeter portion of the n-type semiconductor layer and contacting the first conductive layer;
at least a portion of the third side contact region is aligned with the second direction;
at least a portion of the fourth side contact region is aligned with the second direction; and
the plurality of first island-shaped contact regions are between the third side contact region and the fourth side contact region in the first direction.

8. The light-emitting element according to claim 7, wherein:
the second conductive layer comprises a first p-side portion and a second p-side portion;
a direction from the first p-side portion toward the second pad electrode is aligned with the third direction;
a direction from the second p-side portion toward the semiconductor stacked body is aligned with the third direction;
the third side contact region comprises a first end portion positioned toward the first side, and a second end portion positioned toward the second side; and the first end portion is between the second end portion and the second p-side portion in the second direction.

9. The light-emitting element according to claim 8, further comprising:
a third conductive layer located between the second p-side portion and the p-type semiconductor layer;
wherein the third conductive layer electrically connects the second conductive layer and the p-type semiconductor layer.

10. The light-emitting element according to claim 9, wherein the third conductive layer comprises at least one selected from the group consisting of Ag and Al.

11. The light-emitting element according to claim 7, wherein the third side contact region is continuous with the second side contact region.

12. The light-emitting element according to claim 7, wherein:
the n-type semiconductor layer comprises a plurality of the third side contact regions; and
a direction from a first of the plurality of third side contact regions toward a second of the plurality of third side contact regions is aligned with the second direction.

13. The light-emitting element according to claim 1, wherein:
the n-type semiconductor layer comprises a plurality of the second side contact regions; and
a direction from a first of the plurality of second side contact regions toward a second of the plurality of second side contact regions is aligned with the first direction.

14. The light-emitting element according to claim 1, wherein:
the light-emitting element comprises a plurality of the first pad electrodes; and
the second pad electrode is provided between the first pad electrodes in the first direction.

15. The light-emitting element according to claim 1, further comprising:
an insulating layer located between the first conductive layer and the base member and between the second conductive layer and the base member;
wherein the insulating layer electrically insulates the first conductive layer from the base member and electrically insulates the second conductive layer from the base member.

\* \* \* \* \*